(12) United States Patent
Watanabe et al.

(10) Patent No.: US 7,391,093 B2
(45) Date of Patent: Jun. 24, 2008

(54) SEMICONDUCTOR DEVICE WITH A GUARD-RING STRUCTURE AND A FIELD PLATE FORMED OF POLYCRYSTALLINE SILICON FILM EMBEDDED IN AN INSULATING FILM

(75) Inventors: Mitsuru Watanabe, Hyogo (JP); Tetsuya Fukui, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/099,454

(22) Filed: Apr. 6, 2005

(65) Prior Publication Data

US 2006/0131685 A1    Jun. 22, 2006

(30) Foreign Application Priority Data

Dec. 17, 2004    (JP)    ............................. 2004-365655

(51) Int. Cl.
*H01L 27/095* (2006.01)
(52) U.S. Cl. .................. 257/484; 257/127; 257/170; 257/409; 257/452; 257/605
(58) Field of Classification Search ................ 257/484, 257/486, 666, 678, 127, 170, 409, 452, 605
See application file for complete search history.

(56) References Cited

U.S. PATENT DOCUMENTS

| | | | | |
|---|---|---|---|---|
| 5,124,772 A | * | 6/1992 | Hideshima et al. | .......... 257/110 |
| 5,334,873 A | * | 8/1994 | Cha | ............................. 257/666 |
| 5,464,992 A | * | 11/1995 | Okabe et al. | ................. 257/139 |
| 6,376,890 B1 | * | 4/2002 | Tihanyi | ....................... 257/483 |
| 6,831,345 B2 | | 12/2004 | Kinoshita et al. | |
| 2002/0113301 A1 | * | 8/2002 | Tai | .............................. 257/678 |
| 2003/0113954 A1 | * | 6/2003 | Glenn et al. | ................. 438/124 |
| 2004/0173820 A1 | | 9/2004 | Kinoshita et al. | |

FOREIGN PATENT DOCUMENTS

JP    2003-101039    4/2003

* cited by examiner

*Primary Examiner*—Evan Pert
*Assistant Examiner*—Tan Tran
(74) *Attorney, Agent, or Firm*—Oblon, Spivak, McClelland, Maier & Neustadt, P.C.

(57) ABSTRACT

A semiconductor device has a semiconductor device chip with upper and lower terminal electrodes, and upper and lower frames bonded to the upper and lower terminal electrodes, respectively, with solder material, wherein the semiconductor device chip includes: a semiconductor layer of a first conductivity type; a diffusion layer of a second conductivity type, which is selectively formed in the semiconductor layer; a plurality of guard-ring layers of the second conductivity type, which are formed outside of the diffusion layer in the semiconductor layer; an insulating film formed on the semiconductor layer; and a field plate formed of a polycrystalline silicon film embedded in the insulating film.

8 Claims, 5 Drawing Sheets

US 7,391,093 B2

SEMICONDUCTOR DEVICE WITH A GUARD-RING STRUCTURE AND A FIELD PLATE FORMED OF POLYCRYSTALLINE SILICON FILM EMBEDDED IN AN INSULATING FILM

CROSS-REFERENCE TO RELATED APPLICATION

This application is based on and claims the benefit of priority from the prior Japanese Patent Application No. 2004-365655, filed on Dec. 17, 2004, the entire contents of which are incorporated herein by reference.

BACKGROUND OF THE INVENTION

1. Field of the Invention

This invention relates to a semiconductor device with a guard-ring structure for achieving a high breakdown voltage property and a method of fabricating the device. More specifically, the invention relates to a semiconductor device, in which upper and lower electrodes of a planer-type device chip are bonded to upper and lower conductive frames respectively with solder material.

2. Description of Related Art

In the field of power-use semiconductor devices, there has been provided such a technique that guard-ring layers are formed to surround a terminal diffusion layer, and a field plate is disposed above the guard-ring layers for controlling the depletion layer extended in a high-resistive semiconductor layer to achieve a high breakdown voltage (see, Unexamined Japanese Patent Application Publication No. 2003-101039).

FIG. 11 shows a sectional view of a main portion of a planer-type semiconductor device with a guard-ring structure, to which a wire bonding scheme is adapted. This semiconductor device chip is a diode, which has a high-resistive N-type semiconductor substrate 101 serving as a base semiconductor layer; a P-type diffusion layer serving as an anode layer 102, which is selectively formed in the top surface of the substrate 101; and an N$^+$-type cathode layer 103 formed in the bottom surface.

In the top surface of the N-type base layer 101, a plurality of guard-ring layers 104 are formed of P-type diffusion layers as to surround the anode layer 102. Formed in periphery of the chip surface is N$^+$-type channel stopper layer 105.

The top surface of the device is covered with an insulating film 106 such as silicon dioxide, and an anode electrode 107 is formed to be contacted with the anode layer 102 via a contact hole formed in the insulating film 106. A part of the anode electrode 107 is extended on the insulating film 106 to serve as a field plate 107a overlying the first guard-ring layer 104. A main field plate 108 overlying the second and third guard-ring layers 104 and an equi-potential ring (EQPR) electrode 109, which is connected to the channel stopper layer 105 and extended on the insulating film 106, are formed simultaneously with the anode electrode 107.

A passivation film 110 is formed on the top surface in which the anode electrode 107, field plate 108 and EQPR electrode 109 are formed. The passivation film 110 is a plasma CVD film (for example, silicon nitride or silicon dioxide) or a polyimide film. A hole is formed in this passivation film 110, and then wire 112 is bonded to the anode electrode 107.

The above-described high-voltage semiconductor device with the conventional wire-bonding scheme has drawbacks such as: it is difficult to thin the device due to the bonding wire; and it is difficult to secure a high current-proof. To solve these problems, it is desirable to use a solder-bonding scheme such as to bond a semiconductor device chip to conductive frames with solder material.

However, when such the solder-bonding scheme is adapted to a planer-type semiconductor device, another problem occurs. For example, FIG. 12 shows an example, in which the anode electrode 107 of the same semiconductor device chip as shown in FIG. 11 is bonded to a conductive frame 113 with solder material 111. For achieving such the solder-bonding, it is required to use a laminated metal film (for example, V/Ni/Au film), which has a good wetting property for solder material, for the terminal electrodes (i.e., anode electrode and others) in place of a normally-used Al electrode.

In case such the laminated metal film is used, however, it is not permitted to use the passivation film 110 as shown in FIG. 11. The reason is as follows. If the passivation process is performed in a high temperature circumstance of about 300° C. or more after having formed the anode electrode, it will be generated melting of Ni, oxidization of Au and the like, and thereby resulting in that the solder-wetting property of the anode electrode is deteriorated.

Therefore, FIG. 12 shows such an example in which anode electrode 107 is solder-boded to frame 113 without a passivation film covering the anode electrode 107 and field plate 108. In this case, however, sprayed solder material 111a may be stuck between anode electrode 107 and field plate 108 to short-circuit therebetween. As a result, the mode of the depletion layer extending at a reverse bias application time may become different from a desirable state, and the breakdown voltage property will be deteriorated.

Additionally, in the structure of FIG. 12, when a high voltage is applied to the device, it is easy to occur space discharge (i.e., spark) between the field plate 108 and EQPR electrode 109 because there is no passivation film. This will lead to insulation breakdown and deterioration of the device characteristics.

As described above, there are various problems in the double-sided solder-bonding scheme for planar-type semiconductor devices. Therefore, currently used double-sided solder-bonding high-voltage semiconductor devices are not formed as planer-type ones, but usually formed as mesa-type ones. However, mesa-type semiconductor devices have some astatic factors as follows: leakage current at a reverse bias time is larger than that of planer-type one because the PN junction is terminated to the mesa slope; and thermal runaway may be easily arisen under a high temperature circumstance.

SUMMARY OF THE INVENTION

According to an aspect of the present invention, there is provided a semiconductor device having a semiconductor device chip with upper and lower terminal electrodes, and upper and lower frames bonded to the upper and lower terminal electrodes, respectively, with solder material, wherein the semiconductor device chip includes:

a semiconductor layer of a first conductivity type;

a diffusion layer of a second conductivity type, which is selectively formed in the semiconductor layer;

a plurality of guard-ring layers of the second conductivity type, which are formed outside of the diffusion layer in the semiconductor layer;

an insulating film formed on the semiconductor layer; and a field plate formed of a poly-crystalline silicon film embedded in the insulating film.

DETAILED DESCRIPTION OF THE EMBODIMENTS

Illustrative embodiments of this invention will be explained with reference to the accompanying drawings below.

Figure 6:
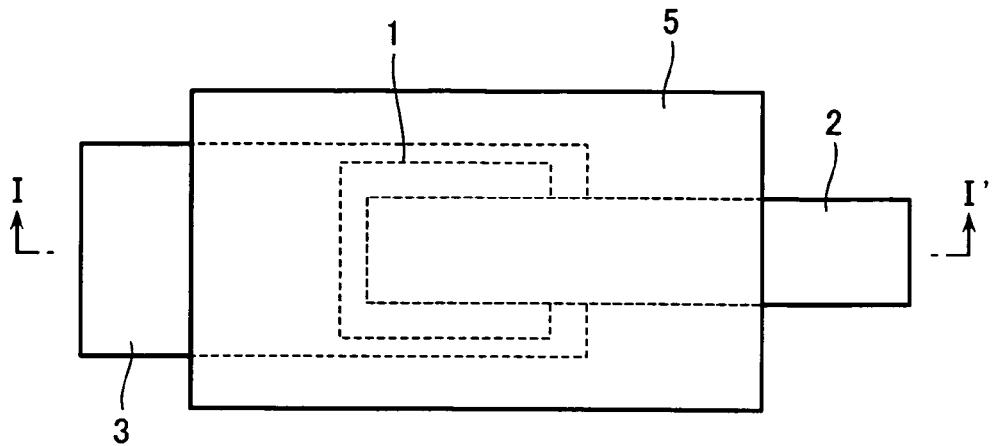
FIG. 6 is a plan view of frame-mounting state of the semiconductor device chip.
Figure 7:
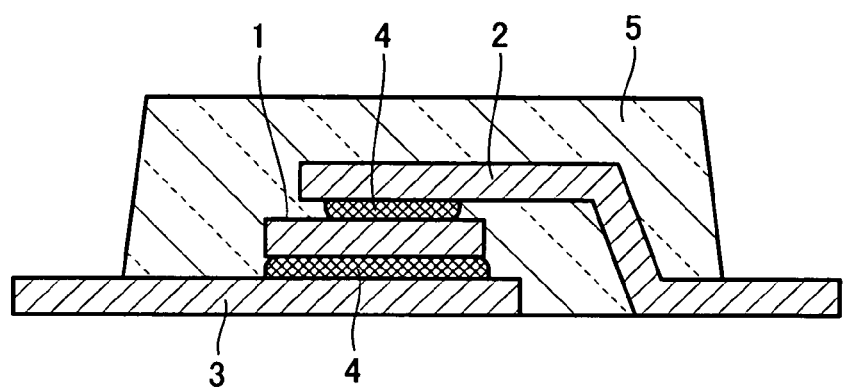
FIG. 7 is a sectional view of the state taken along line I-I of FIG. 6.
Figure 8:
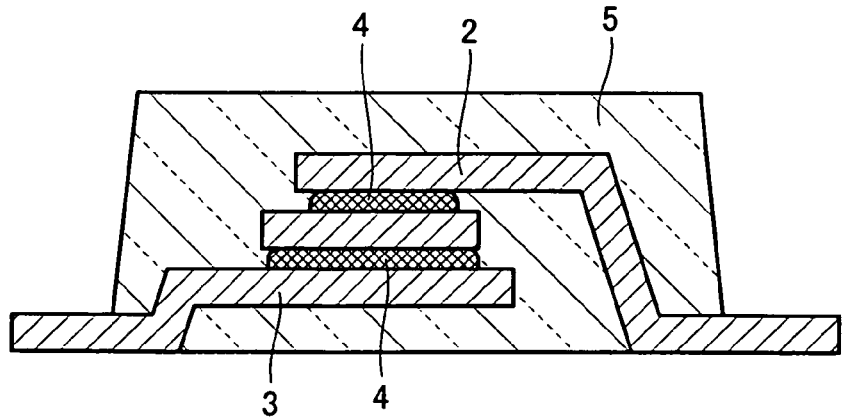
FIG. 8 is another sectional view of the state taken along line I-I' in FIG. 6.

FIG. 6 is a plan view of a semiconductor device in accordance with an embodiment, and FIGS. 7 and 8 are sectional views of the device taken along line I-I' in FIG. 6, respectively. The semiconductor device chip 1 is a high-breakdown planer-type one, upper and lower terminal electrodes of which are bonded to upper and lower conductive frames formed of, for example, Cu, with solder material 4. The device chip 1 and frames 2 and 3 are sealed with resin mold 5.

Figure 1:
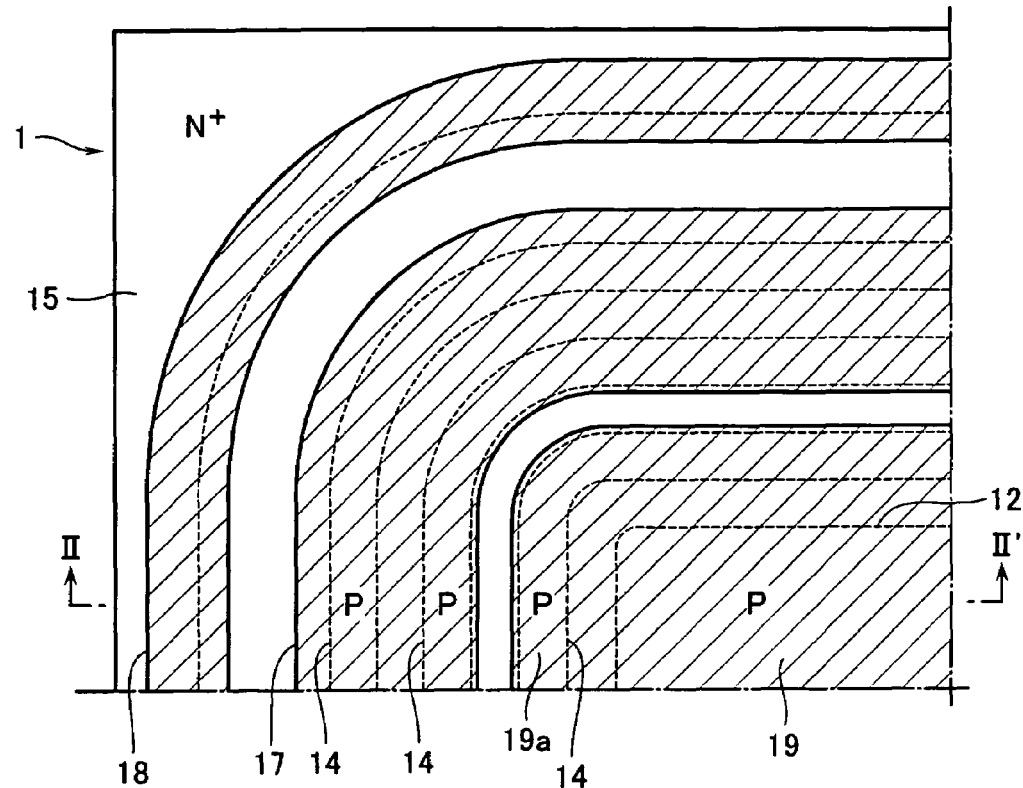
FIG. 1 is a plan view of a semiconductor device chip in accordance with an embodiment of the present invention.
Figure 2:
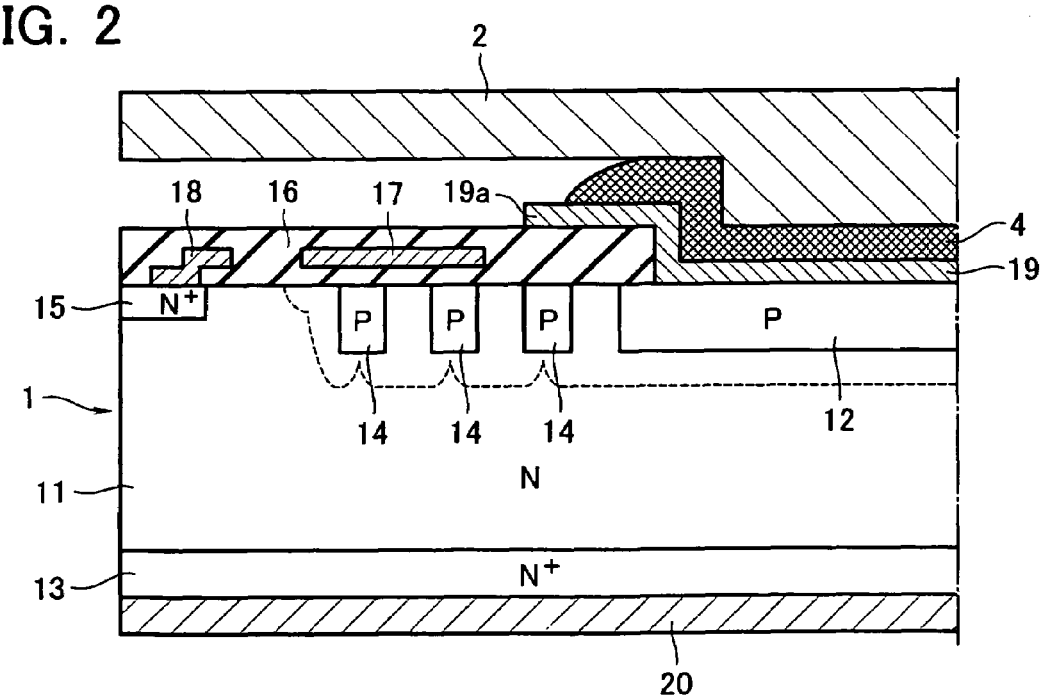
FIG. 2 is a sectional view of the chip taken along line I-I' in FIG. 1.

FIG. 1 is a plan view of the quartered semiconductor device chip 1, and FIG. 2 is a sectional view of the device taken along line II-II' in FIG. 1. The semiconductor device chip 1 is a rectify-use PN junction diode with a high resistive N-type semiconductor substrate 11 serving as a base semiconductor layer. A P-type diffusion layer serving as an anode layer 12 is selectively formed in the top surface of the semiconductor layer 11; and $N^+$-type cathode layer 13 in the bottom surface thereof.

Further formed in the top surface of the base semiconductor layer 11 are a plurality of guard-ring layers 14, which are p-type diffusion layers formed outside of the anode layer 12 and arranged at a certain pitch to surround the anode layer 12. While three guard-rings 14 are used in this example, it should be appreciated that two or more guard-rings are formed. In periphery of the chip surface, $N^+$-type diffusion layer is formed to serve as a channel stopper layer (EQPR layer) 15.

The top surface of the device chip, in which diffusion layers have been formed, is covered with an insulating film 16 such as silicon dioxide film. A terminal electrode of the anode layer 12, i.e., anode electrode 19 is formed on the insulating film 16 to be contacted with the anode layer 12 via a contact hole formed in the insulating film 16. The anode electrode 19 is formed of a laminated metal film with a good solder wetting property. For example, the laminated metal film is one which mainly contains Ni such as V/Ni/Au, Ti/Ni/Au, V/Ni/Ag (each denoted by lower layer/intermediate layer/upper layer) and the like. Alternatively, another laminated metal film containing Fe or Co in place of Ni may be used.

A part of the anode electrode 19 is extended on the insulating film 16 as overlying the first guard-ring 14, thereby serving as a field plate 19a set at the same potential as the anode electrode 19.

On the bottom surface of the device chip, an $N^+$-type cathode diffusion layer 13 is formed, on the surface of which a cathode electrode 20 is formed. The cathode electrode 20 is formed of the same laminated metal film as the anode electrode 19 because it is bonded to a conductive frame with solder material.

Field plate 17 is disposed as overlying the second and third guard-rings 14 in the base layer 11, which is formed of a polycrystalline silicon (i.e., polysilicon) film embedded in the insulating film 16. An equi-potential ring electrode (EQPR electrode) 18 is also embedded in the insulating film 16, which is formed of the same polysilicon film as the field plate 17 and contacted with $N^+$-type stopper layer 15.

Although there has been prepared, in the example shown in FIGS. 1 and 2, only one electrically floating field plate 17, four or more guard-ring layers may be disposed in other devices to be specified as higher breakdown ones, and two or more field plates may be disposed in accordance with increasing the guard-ring layers.

The polysilicon film used for the field plate 17 and EQPR electrode 18 is a resistive film in which impurities such as P, B. As and so on are doped, and the thickness may be suitably selected in a range of 10 nm to 3000 nm.

The process for forming the field plate 17 and anode electrode 18 on the top surface of the device chip will be described bellow with reference to FIGS. 3 to 5. In the top surface of the device chip 1, anode diffusion layer 12 and guard-ring layers 14 surrounding it are formed by selective impurity doping. Outside of the guard-ring layers 14, i.e., in periphery of the chip, $N^+$-type stopper layer 15 is formed. The formation process order of these diffusion layers may be optionally selected.

Figure 3:
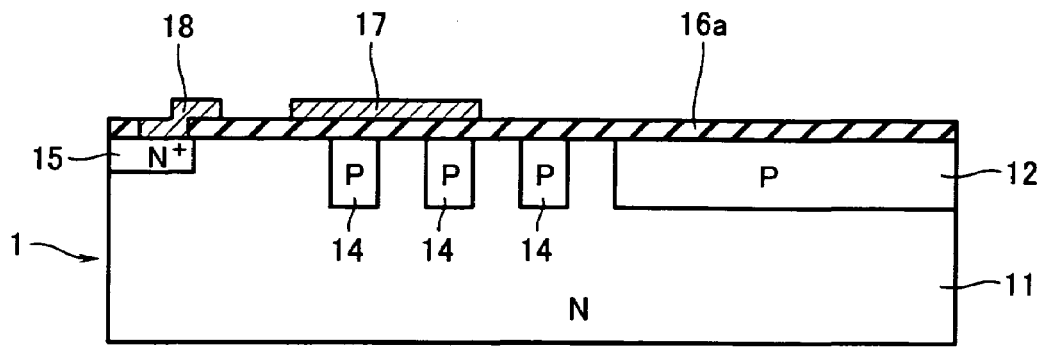
FIG. 3 is a sectional view showing a step of forming field plate and stopper electrode of the semiconductor device chip.

On the top surface in which above-described diffusion layers have been formed, a silicon dioxide film 16a is formed as shown in FIG. 3. Following it a contact hole for $N^+$-type stopper layer 15 is formed in the oxide film 16a by RIE (Reactive Ion Etching), and then a polysilicon film is deposited by CVD (Chemical Vapor Deposition) and patterned by RIE, so that EQPR electrode 18 and field plate 17 are formed. Note here that the method of forming the contact hole and patterning is not limited to RIE, but CDE (Chemical Dry Etching) and wet etching may be used. The polysilicon film is impurity-doped one, in which P, B or As is doped in the film formation step or by ion implantation after film formation.

Figure 4:
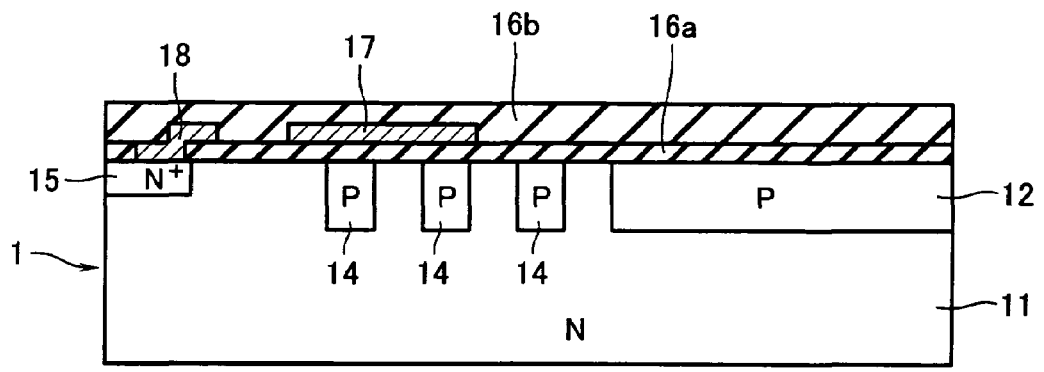
FIG. 4 is a sectional view showing a step of forming CVD oxide film of the semiconductor device chip.
Figure 5:
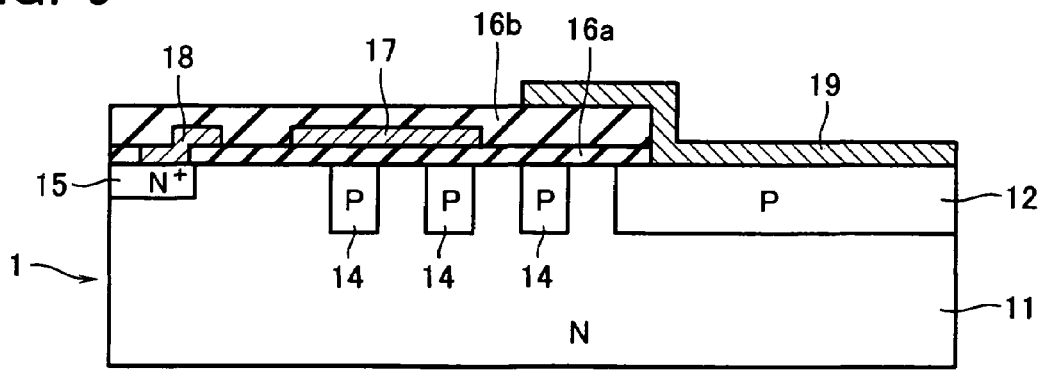
FIG. 5 is a sectional view showing a step of forming the anode electrode of the semiconductor device chip.

Then, as shown in FIG. 4, silicon dioxide film 16b is deposited by CVD. Following it, as shown in FIG. 5, a contact hole is formed above the anode layer 12, and then anode electrode 19 is formed. The anode electrode 19 is, as described above, formed of a laminated metal film such as V/Ni/Au with a good solder wetting property.

As described above, it is obtained such a device surface state that field plate 17 and electrode 18 are embedded in the oxide film 16 (16a, 16b), and anode electrode 19 is exposed. Note here that in order to prevent the anode electrode 19 from being spoiled in the solder wetting property, no passivation process is used. Thereafter, as shown in FIG. 2, the anode electrode 19 and upper conductive frame 2 are bonded with solder material 4.

In FIG. 2, there is shown a depletion layer expanded in the N-type base layer 11 when a back bias is applied to the diode by a dotted line. As shown in FIG. 2, the depletion layer is expanded in the lateral direction by the aid of the field plates 19a and 17, thereby reducing the electric field concentration. At the back bias application time, the field plate 17 is set at an intermediate potential between anode and cathode voltages, and it serves for expanding the depletion layer in the lateral direction along the guard-ring layers 14.

The channel stopper layer 15 serves for preventing the chip side from being inverted to form an idle channel due to that the depletion layer is terminated to the chip side surface. The EQPR electrode 18 contacted with this stopper layer 15 has an extended portion (i.e., MOS structure portion), which is opposed to a portion of N-type base layer 11 adjacent to the stopper layer 15 via the insulating film 16 (i.e., lower oxide film 16a). With this structure, the EQPR electrode 18 serves for controlling the surface potential of the N-type base layer 11 so as to reduce the electric field of the front of the depletion layer, which is expanded from the anode layer 12 in the lateral direction under a reverse bias condition.

Figure 12:
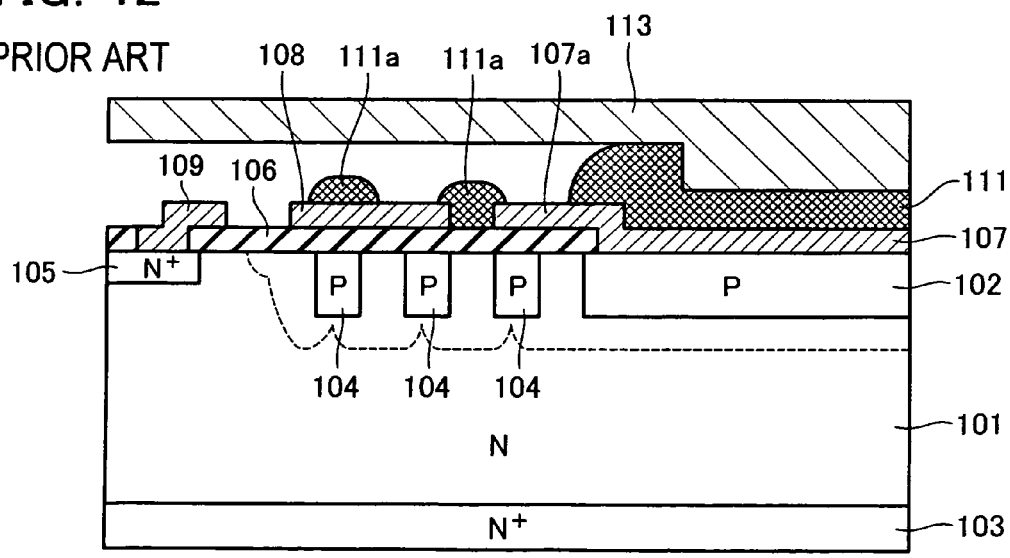
FIG. 12 is a sectional view showing a state that the basic chip of the semiconductor device shown in FIG. 11 is bonded to frames.

According to this embodiment, the field plate 17 and EQPR electrode 18 are embedded in the silicon oxide film 16. Therefore, even if solder material is sprayed at solder bonding time at the anode side, there is not generated an accident that the field plate and anode electrode are shorted-circuit as explained in FIG. 12. There is no metal film for attracting the sprayed solder material, and it will be repelled by the oxide film 16.

Although there is not formed a passivation film, the field plate 17 and EQPR electrode 18 are embedded in the oxide film 16, so that spark will not occur between them.

Further, there is no step due to metal electrode(s) on the top surface of the oxide film 16, and the top surface is kept flat. Therefore, when resin-molding, resin is smoothly injected into the space between conductive frame 2 and device chip 1. If there is remained a void between the conductive frame and device chip, in which resin is not injected, it may cause spark at a high voltage application time. According to this embodiment, such the spark will be prevented, and insulator breakdown and deterioration of the device characteristics and reliability due to it will also be prevented.

Since the solder bonding scheme is used in this embodiment, it is possible to make the product thin in comparison with the case, to which a wire bonding scheme is adapted. Further, the heat radiation property becomes better than the case with the bonding wire scheme because the upper conductive frame shows a better thermal conductibility than that of the bonding wire. Therefore, this embodiment is effective for devices with a high current-proof.

Figure 9:
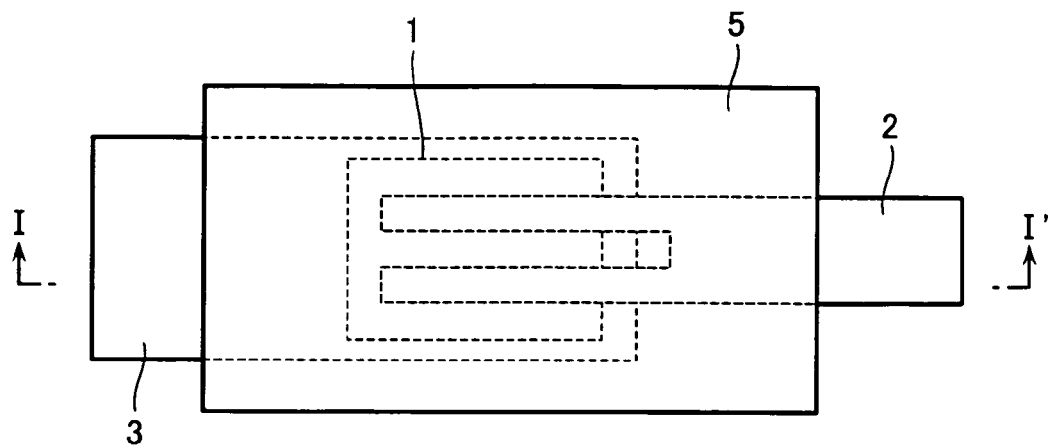
FIG. 9 is another plan view of frame-mounting state of the semiconductor device chip.
Figure 10:
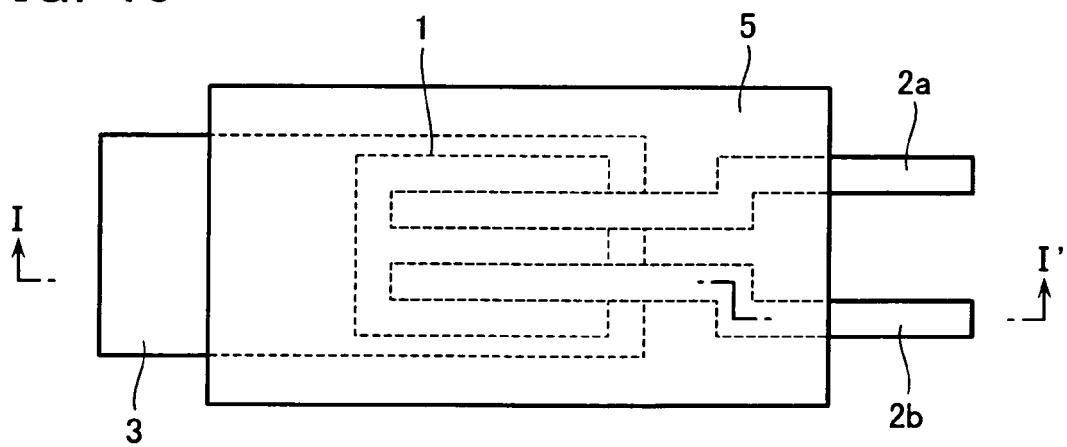
FIG. 10 is still another plan view frame-mounting state of the semiconductor device chip.
Figure 11:
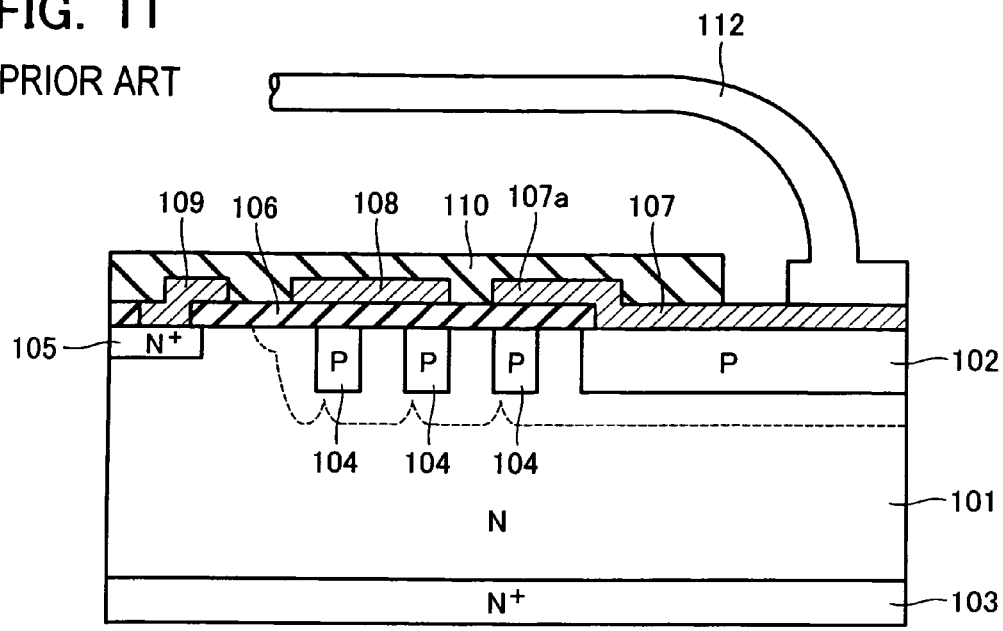
FIG. 11 is a sectional view of a conventional semiconductor device of a wire-bonding type.

The present invention is not limited to the above-described embodiment. For example, FIG. 9 shows another example, in which the bonding portion of the upper conductive frame 2 is divided into two branches. Further, although the above-described embodiment is adapted to a rectifying diode, the present invention may be adapted to other kinds of high breakdown voltage devices such as bipolar transistor, MOS transistor and IC including such the high breakdown voltage devices. For example, in case the device is a bipolar transistor, two upper conductive frames 2a and 2b are prepared as shown in FIG. 10, and these are connected to emitter and base electrodes, respectively, which are disposed on the top surface of the device chip.

This invention is not limited to the above-described embodiments. It will be understood by those skilled in the art that various changes in form and detail may be made without departing from the spirit, scope, and teaching of the invention.

What is claimed is:

1. A semiconductor device having a semiconductor device chip with upper and lower terminal electrodes, and upper and lower frames bonded to the upper and lower terminal electrodes, respectively, with solder material, wherein said semiconductor device chip comprises:

a semiconductor layer of a first conductivity type;

a diffusion layer of a second conductivity type, which is selectively formed in said semiconductor layer;

a plurality of guard-ring layers of the second conductivity type, which are formed outside of said diffusion layer in said semiconductor layer;

an insulating film formed on said semiconductor layer over said guard ring layers; and a field plate being formed of a poly-crystalline silicon film embedded in said insulating film, said field plate formed over said guard-ring layers except an innermost one of the guard-ring layers;

said upper terminal electrode being formed to extend from said diffusion layer over a part of said insulating film and over the innermost one of the guard-ring layers; and an upper surface of said upper terminal electrode is externally exposed, with no passivation film thereon.

2. The semiconductor device according to claim 1, wherein said field plate is formed of a poly-crystalline silicon film in which impurities are doped at the film deposition time or later.

3. The semiconductor device according to claim 1, wherein said semiconductor device chip further comprises:

a channel stopper layer of the first conductivity type, which is formed in said semiconductor layer in the chip periphery; and an equi-potential electrode formed of the same polycrystalline silicon film as the field plate embedded in said insulating film, contacted with said channel stopper layer and disposed as extending above said semiconductor layer portion adjacent to said channel stopper layer.

4. The semiconductor device according to claim 1, wherein the upper terminal electrode of said semiconductor device chip is formed of a laminated metal film to be contacted with said diffusion layer, which mainly contains one selected in Ni, Fe and Co.

5. The semiconductor device according to claim 4, wherein the upper terminal electrode is overlain one of said guard-ring layers adjacent to the diffusion layer as a field plate.

6. The semiconductor device according to claim 1, wherein said insulating film is formed of two silicon dioxide films, and wherein said field plate is formed of a polycrystalline silicon film sandwiched between the two silicon dioxide films.

7. The semiconductor device according to claim 1, wherein said semiconductor device chip and said upper and lower conductive frames are sealed with mold resin.

8. The semiconductor device according to claim 1, wherein said semiconductor device chip is a PN-junction diode chip, in which said diffusion layer serves as an anode layer, and a cathode layer of the first conductivity type is formed on the bottom surface of said semiconductor layer.

* * * * *